United States Patent
Moon et al.

(10) Patent No.: US 9,892,964 B1
(45) Date of Patent: Feb. 13, 2018

(54) GAP-FILL POLYMER FOR FILLING FINE PATTERN GAPS AND METHOD FOR FABRICATING SEMICONDUCTOR DEVICE USING THE SAME

(71) Applicants: SK hynix Inc., Gyeonggi-do (KR); Geun Su Lee, Gyeonggi-do (KR)

(72) Inventors: Ji Won Moon, Gyeonggi-do (KR); Jin Wook Jang, Chungcheongbuk-do (KR); Sang Youl Yi, Gyeonggi-do (KR); Sung Jae Lee, Gyeonggi-do (KR); Geun Su Lee, Gyeonggi-do (KR); Young Sun Lee, Gyeonggi-do (KR); Min Su Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/470,387

(22) Filed: Mar. 27, 2017

(30) Foreign Application Priority Data

Jul. 29, 2016 (KR) .................. 10-2016-0097362

(51) Int. Cl.
| | |
|---|---|
| *H01L 23/58* | (2006.01) |
| *H01L 21/768* | (2006.01) |
| *H01L 21/28* | (2006.01) |
| *H01L 21/311* | (2006.01) |
| *H01L 21/04* | (2006.01) |
| *C08G 77/18* | (2006.01) |
| *C08G 77/20* | (2006.01) |
| *C08G 77/00* | (2006.01) |

(52) U.S. Cl.
CPC ........ *H01L 21/76861* (2013.01); *C08G 77/18* (2013.01); *C08G 77/20* (2013.01); *C08G 77/80* (2013.01); *H01L 21/048* (2013.01); *H01L 21/28* (2013.01); *H01L 21/311* (2013.01)

(58) Field of Classification Search
CPC ................. H01L 21/311; H01L 21/312; H01L 21/76861; H01L 21/048; H01L 21/3124; H01L 21/28; C08G 77/16; C08G 77/18; C08G 77/20; C08G 77/80
USPC ....................................... 257/652
See application file for complete search history.

(56) References Cited

U.S. PATENT DOCUMENTS

| | | | |
|---|---|---|---|
| 3,615,272 A | 10/1971 | Collins et al. | |
| 4,399,266 A | 8/1983 | Matsumura et al. | |
| 2005/0215732 A1* | 9/2005 | Watanabe | C08J 5/18 526/62 |
| 2006/0040290 A1* | 2/2006 | Zon | C12N 15/111 435/6.12 |
| 2006/0276053 A1* | 12/2006 | Cho | C03C 3/04 438/782 |
| 2016/0083631 A1* | 3/2016 | Jia | C09J 133/10 525/303 |

FOREIGN PATENT DOCUMENTS

KR 1020110092895 8/2011

* cited by examiner

*Primary Examiner* — Luan C Thai
(74) *Attorney, Agent, or Firm* — IP & T Group LLP

(57) ABSTRACT

A gap-fill polymer for filling fine pattern gaps, which has a low dielectric constant (low-k) and excellent gap filling properties, may consist of a compound formed by condensation polymerization of a first oligomer represented by the formula 1 and a second oligomer represented by the formula 2.

20 Claims, 5 Drawing Sheets

GAP-FILL POLYMER FOR FILLING FINE PATTERN GAPS AND METHOD FOR FABRICATING SEMICONDUCTOR DEVICE USING THE SAME

CROSS-REFERENCES TO RELATED APPLICATION

This U.S. non-provisional patent application claims priority under 35 U.S.C. § 119(a) to Korean application number 10-2016-0097362, filed on Jul. 29, 2016, in the Korean Intellectual Property Office (KIPO), the disclosure of which is incorporated herein by reference in its entirety.

BACKGROUND

1. Technical Field

Various embodiments of the present invention relate generally to a gap-fill polymer for filling fine pattern gaps, and more particularly to a gap-fill polymer having a low dielectric constant and excellent gap filling properties, and to a method for fabricating a semiconductor device using the same.

2. Related Art

In recent years, semiconductor devices have become larger in size and the integration density thereof has increased. According to this tendency, the density of circuit elements and interconnections on substrates has increased, thus causing undesirable electrical interactions such as circuit shorts and cross-talks.

To minimize such interactions, a process for insulating semiconductor devices has been employed which includes a gap-fill or trench-fill process performed using a metal having a higher conductivity than silicon dioxide and a dielectric material having a low dielectric constant (low-k) of less than 3.0.

For conventional semiconductor devices having a line width of 2x or more, a gap-fill process based on step coverage, which uses chemical vapor deposition (CVD) and atomic layer deposition (ALD), and a gap-fill process which uses a deposition-etching-deposition, are generally performed.

In recent years, as semiconductor devices having a line width of 2x or less have been required, there has been proposed a gap-fill process employing a polysilsesquioxane-based insulating film having a dielectric constant of about 2.5-3.1, which can be formed by a spin-on-deposition (SOD) process, instead of an $SiO_2$-based insulating film which has a dielectric constant of 4.0 and which can be formed using chemical vapor deposition (hereinafter referred to as "CVD") (see Patent Documents 1 to 3).

Meanwhile, as the distance between semiconductor devices gradually decreases and the aspect ratio of semiconductor devices increases, there is a problem in that voids and cracks may occur in the gap-fill regions of the semiconductor devices due to the deterioration in step coverage and the bending of the semiconductor devices during conventional gap-fill processes performed using the CVD and ALD processes, thus adversely affecting the operation of the semiconductor devices.

Furthermore, precursors that are used in the CVD and ALD processes have disadvantages in that they are decomposed upon exposure to the air due to their instability, increase maintenance costs and production costs due to their high costs, and reduce productivity (throughput). As used herein, the term "precursors" refers to single organometallic compounds prepared by bonding organic ligands to metals, which undergo a phase change under specific conditions and are used mainly to form thin films (such as pure metal films, metal oxide films or metal nitride films) on wafer surfaces by decomposition of organic ligands.

Precursors comprising silane-based polymers, which are currently used, have a disadvantage in that they are not suitable for use in semiconductor processes, because they fail to provide a sufficiently low dielectric constant, or the mechanical properties of films formed using the precursors are poor, or the content of organic carbon in Insulating films formed using the precursor is high.

Particularly, polymers such as tetramethoxysilane or tetraethoxysilane have problems in that the content of organic carbon in insulating films formed using the polymers is high and in that the polymers have a high moisture absorption rate that greatly increases the dielectric constant, even though the polymers have high mechanical properties. Due to these problems, the use of the polymers as insulating films is limited.

Accordingly, in the technical field to which the present invention pertains, there is an urgent need for the development of precursor materials for filling fine gaps, which can be prepared by an SOD process and have a low dielectric constant, excellent mechanical properties such as modulus, excellent compatibility with pore-forming materials, and greatly improved process applicability.

SUMMARY

The present invention overcomes the above-described problems of existing technology. An object of the present invention is to provide a gap-fill polymer for filling fine pattern gaps, which has a low dielectric constant (low-k) and excellent gap-filling properties.

Another object of the present invention is to provide a gap-fill composition for filling fine pattern gaps, which comprises the gap-fill polymer. Yet another object of the present invention is to provide a method for fabricating a semiconductor device using the gap-fill composition.

To achieve the above objects, in accordance with an embodiment of the present invention, there is provided a gap-fill polymer for filling fine pattern gaps, which is formed by condensation polymerization of a first oligomer represented by the following formula 1 and a second oligomer represented by the following formula 2:

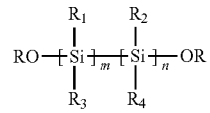

Formula 1

Wherein R is hydrogen or a substituted or unsubstituted $C_1$-$C_{18}$ alkyl group; $R_1$ to $R_4$ are each independently any one selected from the group consisting of a hydrogen atom, a substituted or unsubstituted $C_1$-$C_{18}$ alkyl group, a substituted or unsubstituted $C_2$-$C_{10}$ alkenyl group, a substituted or unsubstituted $C_3$-$C_{10}$ cycloalkyl group, a substituted or unsubstituted $C_6$-$C_{18}$ aryl group, a substituted or unsubstituted $C_6$-$C_{18}$ aralkyl group, and a substituted or unsubstituted $C_6$-$C_{18}$ alkaryl group; and each of m and n represents the number of repeating units in the main chain, and the molar ratio of m:n is 1:0.01 to 30;

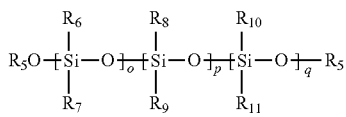
Formula 2

Wherein $R_5$ is any one selected from the group consisting of a hydrogen atom, a hydroxyl group, a substituted or unsubstituted $C_1$-$C_{18}$ alkyl group; $R_6$ to $R_{11}$ are each independently any one selected from the group consisting of a hydrogen atom, a substituted or unsubstituted $C_1$-$C_{18}$ alkyl group, a substituted or unsubstituted $C_1$-$C_{18}$ alkenyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group; and each of o, p and q represents the number of repeating units in the main chain, and the molar ratio of o:p:q is 1:0.01 to 30:0.01 to 30. The first oligomer represented by formula 1 comprises at least one compound selected from the group consisting of compounds represented by the following formulas 1a to 1c:

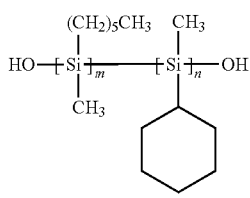
Formula 1a

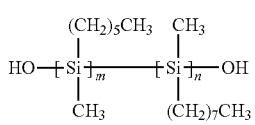
Formula 1b

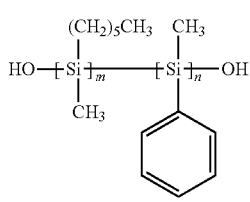
Formula 1c wherein the molar ratio of m:n is 1:0.01 to 30.

The second oligomer represented by formula 2 comprises at least one compound selected from the group consisting of compounds represented by the following formulas 2a to 2c:

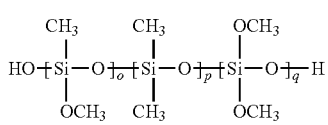
Formula 2a

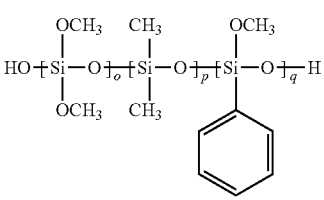
Formula 2b

Formula 2c wherein the molar ratio of o:p:q is 1:0.01 to 30:0.01 to 30. The gap-fill polymer for filling fine pattern gaps may comprise a compound represented by the following formula 3:

Formula 3

Wherein R is hydrogen or a substituted or unsubstituted $C_1$-$C_{18}$ alkyl group; $R_1$ to $R_4$ are each independently any one selected from the group consisting of a hydrogen atom, a substituted or unsubstituted $C_1$-$C_{18}$ alkyl group, a substituted or unsubstituted $C_2$-$C_{10}$ alkenyl group, a substituted or unsubstituted $C_3$-$C_{10}$ cycloalkyl group, a substituted or unsubstituted $C_6$-$C_{18}$ aryl group, a substituted or unsubstituted $C_6$-$C_{18}$ aralkyl group, and a substituted or unsubstituted $C_6$-$C_{18}$ alkaryl group; $R_5$ is hydrogen, a hydroxyl group, or a substituted or unsubstituted $C_1$-$C_{18}$ alkyl group; $R_6$ to $R_{11}$ are each independently any one selected from the group consisting of a hydrogen atom, a substituted or unsubstituted $C_1$-$C_{18}$ alkyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group; and each of m, n, o, p, q, r and s represents the number of repeating units in the main chain, the molar ratio of m:n is 1:0.01 to 30, the molar ratio of o:p:q is 1:0.01 to 30:0.01 to 30, and the molar ratio of r:s is 10:90 to 90:10.

The gap-fill polymer represented by formula 3 comprises at least one compound selected from the group consisting of the following formulas 3a to 3i:

Formula 3a

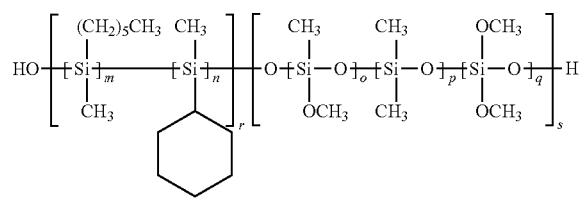

Formula 3b

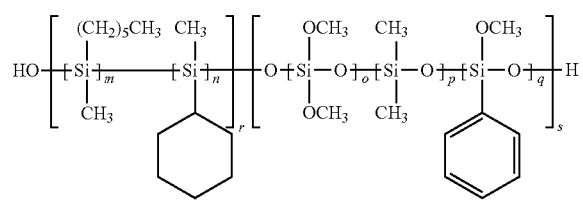

Formula 3c

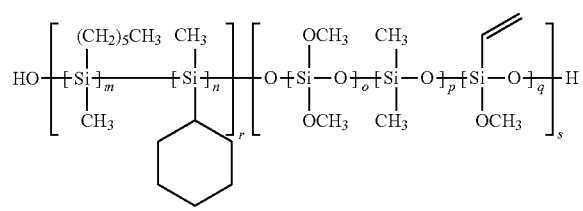

Formula 3d

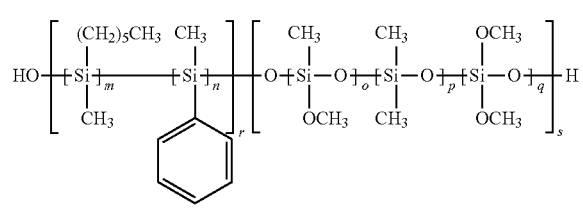

Formula 3e

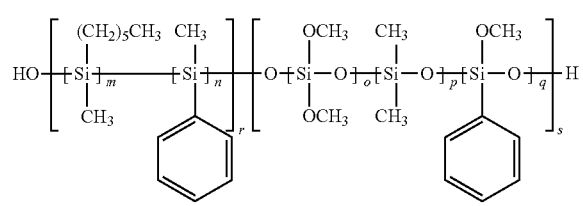

Formula 3f

Formula 3g

Formula 3h

Formula 3i wherein the molar ratio of m:n is 1:0.01 to 30, the molar ratio of o:p:q is 1:0.01 to 30:0.01 to 30, and the molar ratio of r:s is 10:90 to 90:10.

The gap-fill polymer has a weight-average molecular weight (Mw) of 1,000-20,000. More preferably, it may have a weight-average molecular weight of 3,000-18,000.

In accordance with another embodiment of the present invention, there is provided a method for preparing gap-fill polymer for fine photoresist patterns of a semiconductor device, including: dissolving the second oligomer represented by formula 2 in a polymerization solvent; adding the first oligomer represented by formula 1 to the polymerization solvent; and polymerizing the oligomer of formula 1 with the oligomer of formula 2 In the presence of an acid or base catalyst while hydrolyzing the first and second oligomers.

The second oligomer represented by formula 2 is prepared by dissolving at least two alkoxysilane compounds represented by the following formula 4 in water, and then hydrating the compounds in the presence of an acid catalyst, followed by heating of the hydrated compounds:

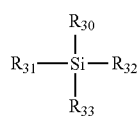

Formula 4 wherein $R_{30}$ $R_{31}$, $R_{32}$ and $R_{33}$ are each independently selected from at least one of the group consisting of a hydrogen atom, a substituted or unsubstituted $C_1$-$C_{18}$ alkyl group, a substituted or unsubstituted $C_1$-$C_{18}$ alkenyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group.

The first oligomer represented by formula 1 is prepared by dissolving at least two compounds represented by the following formula 5 In a polymerization solvent, and then reacting the compounds in the presence of an alkali metal catalyst:

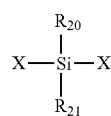

Formula 5 wherein $R_{20}$ to $R_{21}$ are each one independently selected from the group consisting of a hydrogen atom, a substituted or unsubstituted $C_1$-$C_{18}$ alkyl group, a substituted or unsubstituted $C_2$-$C_{10}$ alkenyl group, a substituted or unsubstituted $C_3$-$C_{10}$ cycloalkyl group, a substituted or unsubstituted $C_6$-$C_{18}$ aryl group, a substituted or unsubstituted $C_6$-$C_{18}$ aralkyl group, and a substituted or unsubstituted $C_6$-$C_{18}$ alkaryl group, and X is a halogen atom.

The first oligomer represented by formula 1 and the second oligomer represented by formula 2 are mixed with each other at a weight ratio of 1:9 to 5:5.

The acid catalyst is hydrochloric acid, nitric acid, benzenesulfonic acid, oxalic acid, formic acid, or a mixture of two or more thereof.

The acid or base catalyst is used in an amount of 0.001-5 parts by weight based on 100 parts by weight of the total weight of the oligomers.

In accordance with another embodiment of the present invention, there is provided a gap-fill composition for filling fine pattern gaps, comprising: the gap-fill polymer for filling fine pattern gaps, represented by formula 3; and an organic solvent.

The organic solvent is contained in an amount of 100-3,000 parts by weight based on 100 parts by weight of the gap-fill polymer for filling fine pattern gaps.

The gap-fill composition for filling fine pattern gaps may further comprise one or more additives selected from the group consisting of a cross-linking agent, a cross-linking promoter, and a surfactant.

In accordance with still another embodiment of the present invention, there is provided a method for fabricating a semiconductor device, including: depositing an insulating film on a semiconductor substrate, followed by formation of a patterned hole; depositing an electrode material on the surface of the insulating film including the patterned hole; filling the patterned hole, which has the electrode material deposited therein, with a gap-fill composition for filling fine pattern gaps according to the present invention, followed by baking to planarize the surface of a layer formed of the composition, thereby performing gap-filling; selectively developing and removing the composition coated on the top of the electrode material; selectively etching the top of the electrode material to remove the electrode material from the top; and removing the insulating film and the composition at the same time by wet etching.

The baking is performed at a temperature between 50° C. and 500° C. for 30-300 seconds in two or three steps.

In accordance with another embodiment of the present invention, there is provided a semiconductor device fabricated by the method of the present invention.

BRIEF DESCRIPTION OF THE DRAWINGS

The following detailed description in reference with the accompanying drawings illustrate preferred examples of the present invention, and serve to enable technical concepts of the present invention to be further understood. It is noted, however, that the scope of the present invention should not be limited only to the described embodiments and the drawings.

DETAILED DESCRIPTION

Figure 1:
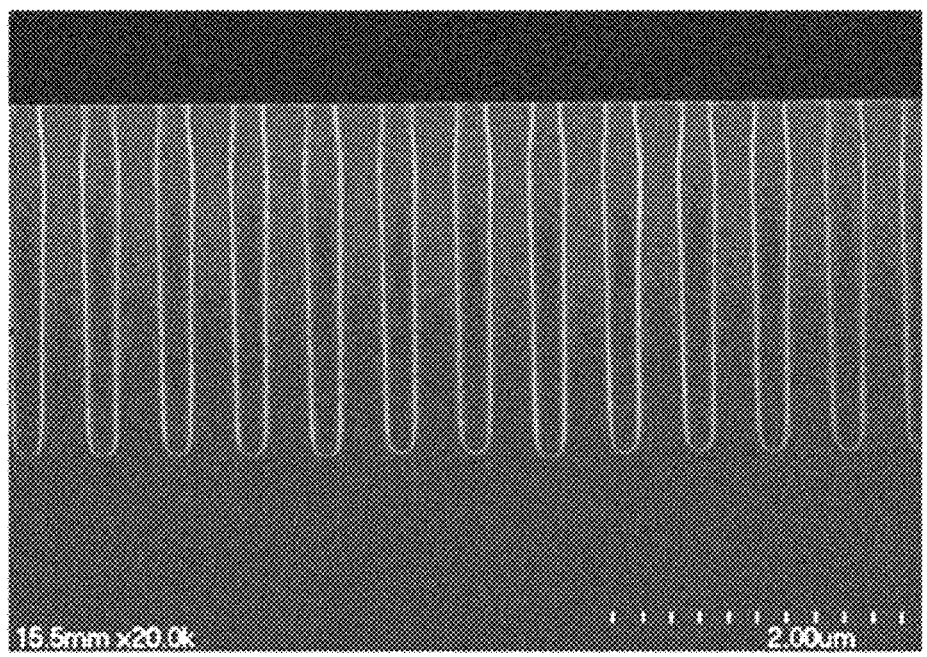
FIGS. 1 to 3 are scanning electron microscope (SEM) photographs showing the gap filling properties of fine gap-filling compositions according to Examples 10 to 12.

Hereinafter, the present invention will be described in further detail. The terms and words used in the specification and claims should not be interpreted as being limited to typical meanings or dictionary definitions, but should be interpreted as having meanings and concepts relevant to the technical scope of the present invention, based on the principle according to which the inventors can appropriately define the concept of the terms to describe their invention in the best manner.

As used herein, unless otherwise defined, the term "substituted" means substituted with a hydroxyl group or an alkyl group having 1 to 6 carbon atoms.

Specifically, in accordance with an exemplary embodiment of the present invention, there is provided a gap-fill polymer for filling fine pattern gaps, which is formed by condensation polymerization of a first oligomer represented by the following formula 1 and a second oligomer represented by the following formula 2:

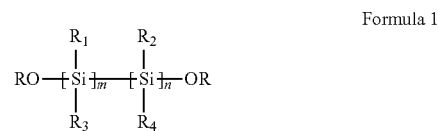

Formula 1

Wherein,
R is hydrogen or a substituted or unsubstituted $C_1$-$C_{18}$ alkyl group; $R_1$ to $R_4$ are each one independently selected from the group consisting of a hydrogen atom, a substituted or unsubstituted $C_1$-$C_{18}$ alkyl group, a substituted or unsubstituted $C_2$-$C_{10}$ alkenyl group, a substituted or unsubstituted $C_3$-$C_{10}$ cycloalkyl group, a substituted or unsubstituted $C_6$-$C_{18}$ aryl group, a substituted or unsubstituted $C_6$-$C_{18}$ aralkyl group, and a substituted or unsubstituted $C_6$-$C_{18}$ alkaryl group; and each of m and n represents the number of repeating units in the main chain, and the molar ratio of m:n is 1:0.01 to 1:30;

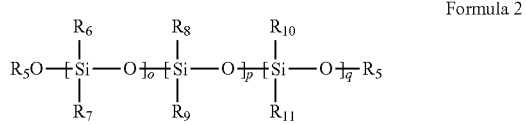

Formula 2

Wherein, $R_5$ is selected from the group consisting of a hydrogen atom, a hydroxyl group, a substituted or unsubstituted $C_1$-$C_{18}$ alkyl group; $R_6$ to $R_{11}$ are each one independently selected from the group consisting of a hydrogen atom, a substituted or unsubstituted $C_1$-$C_{18}$ alkyl group, a substituted or unsubstituted $C_1$-$C_{18}$ alkenyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group; and each of o, p and q represents the number of repeating units in the main chain, and the molar ratio of o:p:q is 1:0.01 to 30:0.01 to 30.

As described above, the gap-fill polymer for filling fine pattern gaps according to the present invention contains the first oligomer of formula 1. As a result, a film formed using the polymer has low the dielectric constant due to an increase in silicon (Si)-to-carbon (C) bonds, and good etch selectivity with respect to a carbon hard mask.

Examples of the first oligomer represented by formula 1 Include compounds represented by formulas 1a to 1c:

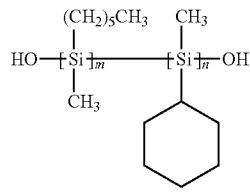

Formula 1a

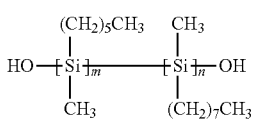

Formula 1b

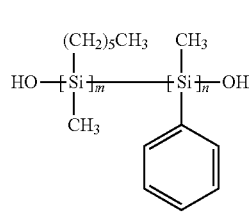

Formula 1c

Wherein, the molar ratio of m:n is 1:0.01 to 30.

In addition, the gap-fill polymer for filling fine pattern gaps according to the present invention contains the oligomer having a siloxane structure as shown in formula 2 and thus has excellent thermal stability and low thermal shrinkage, and can increase the density of a coating film to thereby increase the mechanical properties of the coating film.

Particularly, the second oligomer represented by formula 2 has an increased gap-filling ability due to its high flexibility, and also shows excellent storage stability due to its low thermal stress and low thermal stress.

Examples of the second oligomer represented by formula 2 include compounds represented by the following formulas 2a to 2c:

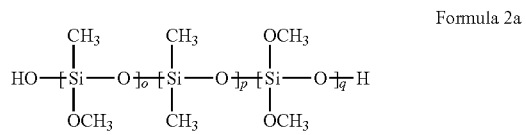

Formula 2a

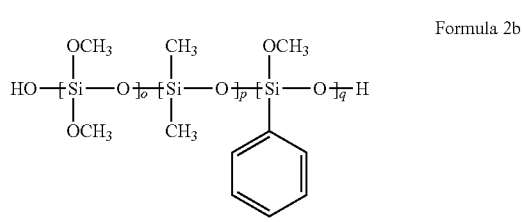

Formula 2b

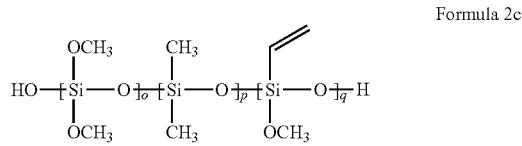

Formula 2c

Wherein, the molar ratio of o:p:q is 1:0.01 to 30:0.01 to 30.

The gap-fill polymer for filling fine pattern gaps according to the present invention may comprise a compound represented by the following formula 3:

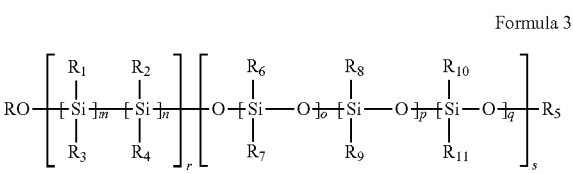

Formula 3

Wherein, $R_5$ is selected from the group consisting of a hydrogen atom, a hydroxyl group, a substituted or unsubstituted $C_1$-$C_{18}$ alkyl group; $R_6$ to $R_{11}$ are each one independently selected from the group consisting of a hydrogen atom, a substituted or unsubstituted $C_1$-$C_{18}$ alkyl group, a substituted or unsubstituted $C_1$-$C_{18}$ alkenyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group; and each of o, p and q represents the number of repeating units in the main chain, and the molar ratio of o:p:q is 1:0.01 to 30:0.01 to 30.

Specifically, examples of the fine gap-filling polymer represented by formula 3 according to the present invention include compounds represented by the following formulas 3a to 3i:

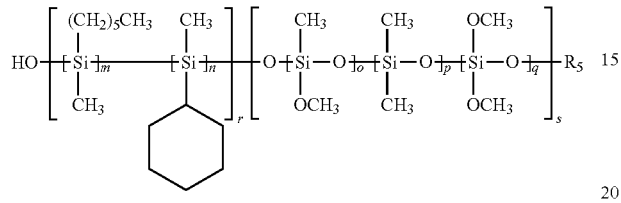

Formula 3a

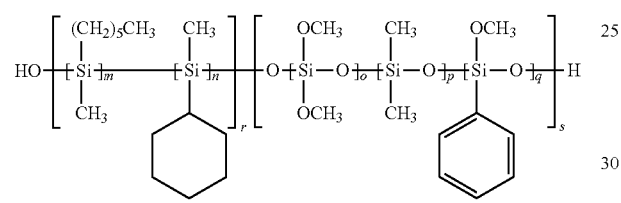

Formula 3b

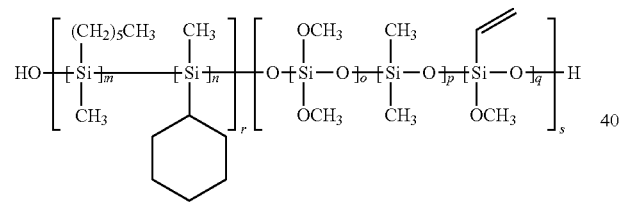

Formula 3c

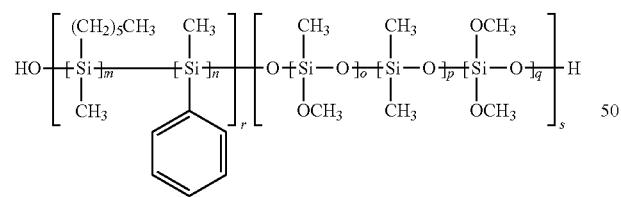

Formula 3d

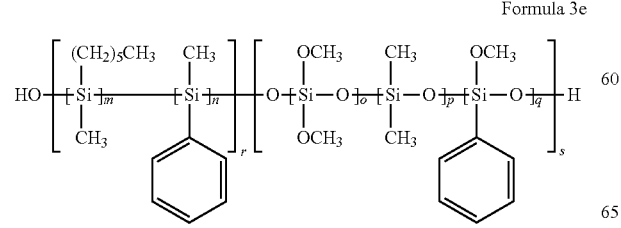

Formula 3e

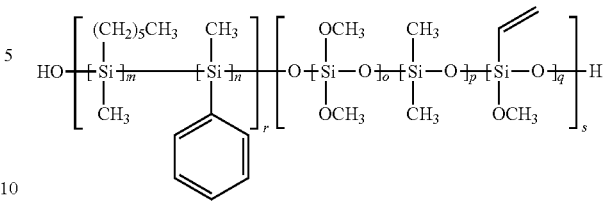

Formula 3f

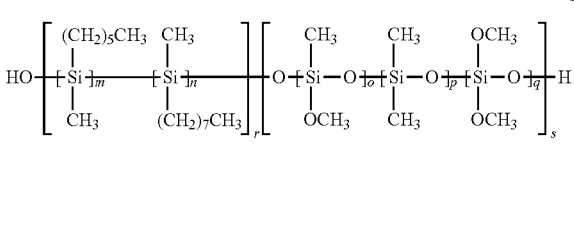

Formula 3g

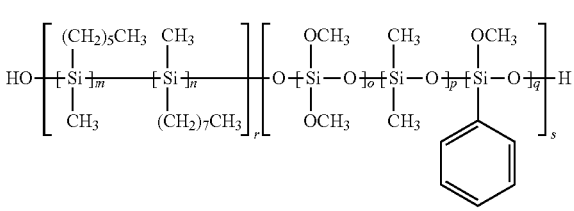

Formula 3h

Formula 3i wherein the molar ratio of m:n is 1:0.01 to 30, the molar ratio of o:p:q is 1:0.01 to 30:0.01 to 30, and the molar ratio of r:s is 10:90 to 90:10.

The gap-fill polymer for filling fine pattern gaps according to the present invention may have a dielectric constant of 3 or less, particularly 1.8-3.0.

Furthermore, the gap-fill polymer for filling fine pattern gaps may have a weight-average molecular weight (Mw) of 1,000-20,000. More preferably, it may have a weight-average molecular weight of 3,000-18,000, and even more preferably of 5,000-15,000, which is a very broad molecular weight distribution which has not yet been reported. This polymer may have excellent gap-filling ability.

The weight-average molecular weight may be measured by gel permeation chromatography using polystyrene as a standard. If the weight-average molecular weight of the polymer is lower than the lower limit of the above-described range, the strength of a film formed using the polymer on a substrate will be insufficient, and the coatability and heat resistance of the polymer can be reduced. On the other hand, if the weight-average molecular weight of the polymer is higher than the upper limit of the above-described range, sufficient gap filling will not be achieved when a composition comprising the polymer is applied to, for example, a pattern having a step difference.

The polymer of the present invention can be prepared by a method including: dissolving the second oligomer represented by formula 2 in a polymerization solvent; adding the first oligomer represented by formula 1 to the polymerization solvent; and polymerizing the first oligomer of formula 1 with the second oligomer of formula 2 in the presence of an acid or base catalyst while hydrolyzing the oligomers.

First, the second oligomer represented by formula 2 can be prepared by dissolving at least two compounds represented by the following formula 4 in water, and then hydrating the compounds in the presence of an acid catalyst, followed by heating of the hydrated compounds. The heating is performed at a temperature between 50° C. and 200°, specifically b.p. (boiling point) of polymerization solvent.

Herein, the acid catalyst used may be the same as or different from the acid catalyst that is used in the preparation of the polymer of the present invention.

Formula 4

Wherein, $R_{30}$ $R_{31}$, $R_{32}$ and $R_{33}$ are each independently selected from at least one of the group consisting of a hydrogen atom, a substituted or unsubstituted $C_1$-$C_{18}$ alkyl group, a substituted or unsubstituted $C_1$-$C_{18}$ alkenyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group.

The first oligomer represented by formula 1 can be prepared by dissolving at least two compounds represented by the following formula 5 in a polymerization solvent, and then reacting the compounds in the presence of an alkali metal catalyst, followed by purification:

Formula 5

Wherein, $R_{20}$ to $R_{21}$ are each one independently selected from the group consisting of a hydrogen atom, a substituted or unsubstituted $C_1$-$C_{18}$ alkyl group, a substituted or unsubstituted $C_2$-$C_{10}$ alkenyl group, a substituted or unsubstituted $C_3$-$C_{10}$ cycloalkyl group, a substituted or unsubstituted $C_6$-$C_{18}$ aryl group, a substituted or unsubstituted $C_6$-$C_{18}$ aralkyl group, and a substituted or unsubstituted $C_6$-$C_{18}$ alkaryl group, and X is a halogen atom.

Herein, suitable examples of the alkali metal catalyst include lithium, sodium, potassium, or alloys thereof. In addition, an alkaline earth metal such as magnesium, barium, strontium, or an alloy thereof, may also be used.

In the process of preparing the fine gap-filling polymer of the present invention by condensation polymerization of the oligomer represented by formula 1 and the oligomer represented by formula 2, the molar ratio between the oligomers can be suitably controlled so as to have desired Si, O and C contents depending on the gap filling property, solubility and coatability of an insulating film to be formed.

For example, the oligomer represented by formula 1 and the oligomer represented by formula 2 may be mixed with each other at a weight ratio of from 1:9 to 5:5, particularly at a weight ratio of 3:7.

Specifically, as the content of the siloxane compound of formula 2 Increases, the polymer has better thermal stability and lower thermal shrinkage, and a harder film having increased density can be formed using the polymer. However, if the ratio of the content of the oligomer represented by formula 1 is more than 5 or if the ratio of the content of the oligomer represented by formula 2 is less than 5, the polymer will have decreased thermal stability and decreased thermal shrinkage, and a film formed using the polymer will have decreased density, and thus have reduced mechanical properties such as hardness. On the other hand, if the ratio of the content of the oligomer represented by formula 1 is less than 1 or if the ratio of the content of the oligomer represented by formula 2 is more than 9, a problem will arise in that the dielectric constant of the polymer increases.

Meanwhile, the organic solvent that is used in the preparation of the polymer according to the present invention is not specifically limited, but may preferably be selected from at least one of the group consisting of $C_2$-$C_{10}$ aliphatic ether, $C_2$-$C_{10}$ aliphatic ketone, $C_3$-$C_{10}$ aliphatic ester, $C_4$-$C_{10}$ alicyclic ketone, $C_4$-$C_{10}$ alicyclic ester, and N—$C_1$-$C_5$ alkyl-substituted $C_4$-$C_{10}$ aliphatic amide. Alternatively, non-limiting examples of the organic solvent that is used in the present invention include aliphatic hydrocarbon solvents such as hexane or heptanes; aromatic hydrocarbon solvents such as anisole, mesitylene or xylene; ketone-based solvents such as methyl isobutyl ketone, 1-methyl-2-pyrrolidone, cyclohexanone, methyl ethyl ketone or acetone; ether-based solvents such as tetrahydrofuran, isopropyl ether, or propylene glycol propyl ether; acetate-based solvents such as ethyl acetate, n-butyl acetate, or propylene glycol methyl ether acetate; alcohol-based solvents such as ethyl alcohol, isopropyl alcohol or butyl alcohol; amide-based solvents such as dimethylacetamide or dimethylformamide; silicon-based solvents; or mixtures thereof.

Suitable examples of an acid catalyst that may be used in the preparation of the polymer according to the present invention include hydrochloric acid, nitric acid, sulfuric acid, acetic acid, methanesulfonic acid, camphorsulfonic acid, p-toluenesulfonic acid, trifluoromethanesulfonic acid, oxalic acid, formic acid, or mixtures thereof. Furthermore, suitable examples of a base catalyst that may be used in the present invention include alkali metal hydroxides such as sodium hydroxide or potassium hydroxide; alkali metal carbonates such as sodium carbonate or potassium carbonate; phosphorus-based compounds such as triphenylphosphine; amines such as triethylamine; or mixtures thereof.

The acid or base catalyst that is used in the polymerization reaction for preparing the polymer may be used in an amount of 0.001-5 parts by weight, preferably 0.01-1 parts by weight, based on 100 parts by weight of the total weight of the oligomers. If the amount of acid or base catalyst used is less than 0.01 parts by weight, there will be disadvantages in that the reaction time is long due to a decrease in the polymerization rate and in that the yield decreases, and if the amount of acid or base catalyst used is more than 1 part by weight, there will be a disadvantage in that an excessive polymerization reaction occurs to produce by-products or to produce a copolymer having a weight-average molecular weight that is higher than desired.

Through hydrolysis and cross-linking by the polycondensation reaction as described above, the alkoxy group (—OR) of the oligomer of formula 1 and the alkoxy group (—OR) of the oligomer of formula 2 can form a crosslink therebetween to thereby produce the polymer of the present invention.

The polycondensation reaction is performed at a temperature between 70° C. and 700° C. and at atmospheric pressure.

Specifically, the oligomer of formula 2 is hydrated by contact with water so that Si—OR is converted to Si—OH. Because the hydration reaction typically generates an alcohol, an additional solvent is not required. The oligomer of formula 2, which contains the Si—OH group obtained by the hydration reaction, may be heated while stirring, and thus can be polymerized by the polycondensation between the Si—OH groups while forming a crosslink with the functional group of the compound of formula 1, thereby forming the copolymer represented by formula 3.

Herein, the hydrolysis and copolymerization reaction may be performed at a suitable temperature for a suitable time. Preferably, it may be performed at a temperature of 50 to 200° C. for about 1-100 hours. In this case, the molecular weight of the polymer can be increased, and the copolymer solution can be stabilized.

As described above, the gap-fill polymer for filling fine pattern gaps according to the present invention comprises Si—Si, Si—O and Si—C bonds, and thus may have high thermal stability. In addition, it is stable in the air, and may have a low dielectric constant (low-k) of 3 or lower, particularly 2.5 or lower. Furthermore, the polymer of the present invention comprises the oligomer of formula 1, which advantageously has a low dielectric constant but disadvantageously has low heat resistance, the oligomer of formula 2, which has low thermal shrinkage due to its high thermal stability and shows excellent mechanical properties such as hardness due to high film density, and thus it may combine the advantages and disadvantages of these compounds. Particularly, a siloxane oligomer composed of Si—O bonds is present in a liquid state in a step before curing even when the molecular weight thereof is very high. Thus, when it is introduced, it can impart flowability to the resulting polymer. Accordingly, the polymer shows excellent flowability in a spin-coating process before curing, and thus has an excellent ability to gap-fill fine structures. Therefore, the polymer can provide a gap-fill composition for filling fine pattern gaps, which combines the advantages and disadvantages of these compounds and also has excellent gap-filling ability, excellent thermal stability, and low heat shrinkage.

In accordance with an exemplary embodiment of the present invention, there is provided a gap-fill composition for filling fine pattern gaps, comprising: a gap-fill copolymer for filling fine pattern gaps according to the present invention; and an organic solvent.

The organic solvent that is used in the present invention makes it possible to easily form a coating film without void formation, and serves to increase the flatness of the film by drying the film slowly. Preferably, the organic solvent may be selected from at least one of among $C_2$-$C_{10}$ aliphatic ether, $C_2$-$C_{10}$ aliphatic ketone, $C_3$-$C_{10}$ aliphatic ester, $C_4$-$C_{10}$ alicyclic ketone, $C_4$-$C_{10}$ alicyclic ester, and N—$C_1$-$C_5$ alkyl-substituted $C_4$-$C_{10}$ aliphatic amide. This solvent is not specifically limited as long as it is one that is generally used in the art. More specifically, the organic solvent that is used in the present invention may be a high-boiling-point solvent that volatilizes at a temperature slightly lower the temperature at which a gap-fill composition for filling fine pattern gaps according to an exemplary embodiment of the present invention is coated, dried and cured. Non-limiting examples of the organic solvent that is used in the present invention include aliphatic hydrocarbon solvents such as hexane or heptanes; aromatic hydrocarbon solvents such as anisole, mesitylene or xylene; ketone-based solvents such as methyl isobutyl ketone, 1-methyl-2-pyrrolidone, cyclohexanone, methyl ethyl ketone or acetone; ether-based solvents such as tetrahydrofuran, isopropyl ether, or propylene glycol propyl ether; acetate-based solvents such as ethyl acetate, n-butyl acetate, or propylene glycol methyl ether acetate; alcohol-based solvents such as ethyl alcohol, isopropyl alcohol or butyl alcohol; and amide-based solvents such as dimethylacetamide or dimethylformamide.

The organic solvent may be contained in an amount of 100-10,000 parts by weight based on 100 parts by weight of the gap-fill polymer for filling fine pattern gaps. Particularly, in order to prevent void formation and increase film flatness, the organic solvent is preferably contained in an amount of 500-10,000 parts by weight.

The dielectric constant of the gap-fill composition for filling fine pattern gaps according to the present invention may be about 1.8-3.0.

Although the fine gap-filling polymer contained in the fine gap-filling composition having a low dielectric constant value according to the present invention can be cured by a self-crosslinking reaction even in the absence of a separate cross-linking agent, the composition may further comprise an additive in order to further improve the gap-fill property.

For example, the gap-fill composition for filling fine pattern gaps according to the present invention may further comprise at least one additive selected from a crosslinking agent, a crosslinking promoter and a surfactant, which can exhibit a more improved effect on cross-linking reactions.

The cross-linking agent is one that is generally used in the art, and is not specifically limited. More specifically, it may be a thermal crosslinking agent. A crosslinking agent that may be used in the present invention is not specifically limited. For example, the crosslinking may be selected from at least one of among phenolic crosslinking agents, benzyl alcohol-based crosslinking agents, isocyanate and alkoxy methyl melamine-based crosslinking agents, substituted urea-based crosslinking agents, epoxy-containing polymer-based crosslinking agents, and compounds derived from these crosslinking agents. In the fine gap-filling composition according to the present invention, the crosslinking agent may be contained in an amount of 0.01-5 parts by weight, preferably 0.1-0.5 parts by weight, based on 100 parts by weight of the fine gap-filling polymer. If the content of the crosslinking agent is lower than the lower limit of the above-described range, crosslinking will be insufficient, and if the content of the crosslinking agent is higher than the upper limit of the above-described range, it can reduce the stability of the resulting organic film.

Furthermore, the crosslinking agent can be activated by the crosslinking promoter. The use of the crosslinking agent together with the crosslinking promoter can exhibit a more improved effect on crosslinking reactions.

The crosslinking promoter may be an acid-generating agent. When a composition comprising an acid-generating agent is applied to a suitable substrate, and then subjected to a thermal process such as a baking process, a crosslinking reaction of the composition can be promoted in the presence of an acid generated from the acid-generating agent. The acid-generating agent that is used in the present invention may be a conventional thermal acid generating agent. The acid-generating agent may be one or more selected from among onium salt-based acid generating agents, including diazonium salt, phosphonium salt, iodonium salt, and combinations thereof; sulfonyl diazomethane-based acid generating agents, N-sulfonyl oxyamide-based acid generating agents, benzoin sulfonate-based acid generating agents, nitrobenzyl sulfonate-based acid generating agents, sulfone-based acid generating agents, glyoxime-based acid generating agents, and triazine-based acid generating agents. The acid-generating agent is preferably contained in an amount of 0.01-10 parts by weight based on 100 parts by weight of the gap-fill polymer for filling fine pattern gaps according to the present invention.

In an exemplary embodiment of the present invention, the gap-fill composition for filling fine pattern gaps may further comprise a surfactant in order to improve dispersibility, film thickness uniformity and fine gap-filling properties. The surfactant that is used in the present invention is one that is generally used in the art, and is not specifically limited. Moore specifically, the coating composition according to the present invention may further comprise a surfactant in order to improve coatability.

Examples of a surfactant that may be used in the present invention include, but are not limited to, nonionic surfactants, including polyether-modified polydimethylsiloxane, polyester-modified polydimethylsiloxane, a polyether-modified, hydroxy-functional polydimethylsiloxane, a polyester-modified, hydroxy-functional polydimethylsiloxane, an acryl-modified, polyester-modified polydimethylsiloxane, polyoxyethylene alkyl ether, polyoxyethylene octyl phenyl ether, polyoxyethylene nonyl phenyl ether, polyoxyethylene alkyl aryl ether, a polyoxyethylene/polyoxypropylene copolymer, sorbitan fatty acid ester, polyoxyethylene sorbitan fatty acid ester, etc. These surfactants may be used alone or in combination of two or more. The surfactant may be contained in an amount of 0.1-10 parts by weight, preferably, 0.5-5 parts by weight, based on 100 parts by weight of the gap-fill polymer for filling fine pattern gaps.

As described above, the fine gap-filling composition comprising the fine gap-filling polymer according to the exemplary embodiment of the present invention can completely fill a hole, which has an aspect (height/diameter) ratio of 1 or more and a diameter of 70 nm or less, by a general spin-coating process, and can planarize a substrate to a certain thickness. Furthermore, a film filled in the hole is free of air voids or pores, and has a uniform film thickness after coating. In addition, the gap-fill composition for filling fine pattern gaps has excellent storage stability, because the development rate of the composition and the molecular weight of the polymer do not change with the passage of storage time.

In accordance with still another embodiment of the present invention, there is provided a method for fabricating a semiconductor device, including: depositing an insulating film on a semiconductor substrate, followed by formation of a patterned hole; depositing an electrode material on the surface of the Insulating film including the patterned hole; filling the patterned hole, which has the electrode material deposited therein, with a gap-fill composition for filling fine pattern gaps according to an exemplary embodiment of the present invention, followed by baking to planarize the surface of a layer formed of the composition, thereby performing gap-filling; selectively developing and removing the composition coated on the top of the electrode material; selectively etching the top of the electrode material to remove the electrode material from the top; and removing the insulating film and the composition at the same time by wet etching.

In implementation of the method of the present invention, the substrate may be a glass substrate, a plastic substrate, a silicon substrate, or a ceramic substrate other than glass.

In addition, in the method of the present invention, the gap-fill composition for filling fine pattern gaps can be formed into a film by use of spin coating such as a spinning-drop method, roll coating, spray coating, bar coating, slit coating using a slit nozzle such as discharge nozzle coating, etc.

Herein, the thickness of the coated film may vary depending on a coating method used, the concentration of solids in the composition, the viscosity of the composition, etc. For example, the composition may be applied to a thickness of 50-600 nm.

In the method of the present invention, after the composition is coated, a baking process may be performed in which heat having a certain temperature or higher or UV light having a certain amount or more of energy, or a combination thereof, is applied to cure the composition. Through this process, a crosslinking reaction can be induced while the organic solvent in the composition coated on the substrate is volatilized, thereby forming a low-k insulating film having an effective heat resistance and an effective film density. In the curing process, UV light curing after thermal curing may be performed, or thermal curing after UV light curing may also be performed.

The baking process may comprise baking at a temperature of 50 to 500° C. for 30-300 seconds. Herein, the baking is performed in several divided steps for uniformity of the coating films, and the temperature and time of the baking can be suitably controlled within the above-described ranges. More preferably, the baking process may comprise a first baking step for curing of the coating films at boiling point of solvent; and a second and/or third baking step for cross-linking in the coating films at over boiling point of solvent.

In accordance with an exemplary embodiment of the present invention, there is provided a semiconductor device fabricated by the fabrication method according to the exemplary embodiment of the present invention.

The semiconductor device may be an integrated circuit device including a semiconductor capacitor or the like.

Hereinafter, the present invention will be described in detail with reference to examples. However, the present invention may be embodied in different forms and should not be construed as limited to the examples described below. Rather, these examples are provided so that this disclosure will be thorough and complete, and will fully convey the scope of the present invention to those skilled in the art.

EXAMPLES

In the following examples, the weight-average molecular weight (Mw) of each of oligomers and copolymers was measured by gel permeation chromatography (GPC) using a GPC device (WATERS) under the following conditions:
Standard sample: standard polystyrene (Shodex, model: SL-105) for plotting of a calibration curve;
GPC column: Shodex KF-801, KF-802, KF-8031(7.8 mm×300 mm);
oven temperature: 40° C.;
sample concentration: 1 wt %;

amount of sample injected: 50 µl;
carrier solvent: tetrahydrofuran (THF); and
flow rate: 1 ml/min.

I. Preparation of Oligomers

Example 1

Under a nitrogen atmosphere, 5 g of sodium was introduced into a reactor containing 210 ml of toluene, and in this state, it was stirred actively heated to 110° C. (boiling point) and held at that temperature for 2 hours to be activated. Then, 11.83 ml of dichloromethylcyclohexylsilane (CAS No. 5578-42-7) and 47.80 ml of dichloromethylhexylsilane (CAS No. 14799-94-1) were slowly added dropwise thereto over 30 minutes and allowed to react. During the reaction, introduction of external air was blocked, and nitrogen gas was introduced through a line to maintain the nitrogen atmosphere. After the reaction was performed for 9 hours, ethanol was added to inactivate any unreacted sodium and introduce an ethoxy group into the end group. Distilled water was added to remove produced salt or impurities, and the supernatant was collected and filtered. The polymer was precipitated using the poor solvent isopropyl alcohol, and the resulting solid was dried, thereby preparing the oligomer of formula 1a. The prepared oligomer had a weight-average molecular weight (Mw) of about 2,810.

Example 2

The oligomer of formula 1b was prepared in the same manner as described in Example 1, except that 13.63 ml of dichloromethyloctylsilane (CAS No. 14799-93-0) was used instead of dichloromethylcyclohexylsilane. The prepared oligomer had a weight-average molecular weight (Mw) of about 3,965.

Example 3

The oligomer of formula 1c was prepared in the same manner as described in Example 1, except that 11.47 ml of dichloromethylbenzylsilane (CAS No. 149-74-6) was used instead of dichloromethylcyclohexylsilane. The prepared oligomer had a weight-average molecular weight (Mw) of about 3,965.

Example 4

0.28 mol of trimethoxymethylsilane (CAS No. 1185-55-3), 0.14 mol of dimethyldimethoxysilane (CAS No. 1112-39-6) and 0.28 moles of tetraethoxysilane (CAS No. 78-10-4) were introduced into a reactor. The mixture was stirred at 20° C. for 60 minutes. Then, a solution of 0.05 moles of nitric acid in 2.1 moles of ultrapure water (18 M Ohm) was added slowly to the mixture over 10 minutes. After completion of the addition, the internal temperature of the reactor was elevated to 30° C. over about 10 minutes, and the reaction mixture was hydrated by further stirring for 2 hours. Then, the internal temperature of the reactor was elevated to 80° C. over about 30 minutes, and the reaction solution was further stirred for 2 hours, thereby preparing the oligomer of formula 2a. The prepared oligomer had a weight-average molecular weight (Mw) of about 3,120.

The reaction product comprising the copolymer was cooled to 30° C. over about 20 minutes, and the content of solids therein was analyzed. Then, propylene glycol methyl ether was added to the reaction product which was then distilled in a vacuum to remove the reaction byproduct alcohol so as to prevent a problem from occurring in a spin coating process.

The propylene glycol methyl ether solution containing the copolymer obtained as described above was placed in a polypropylene container, after which the edge of the container was sealed, followed by cold storage.

Example 5

The oligomer of formula 2b was prepared in the same manner as described in Example 4, except that 0.28 mol of vinyltrimethoxysilane (CAS No. 2768-02-7) was used instead of methyltrimethoxysilane. The prepared oligomer had a weight-average molecular weight of about 2,865.

Example 6

The oligomer of formula 2c was prepared in the same manner as described in Example 4, except that 0.28 mol of phenyltrimethoxysilane (CAS No. 2996-92-1) was used instead of methyltrimethoxysilane. The prepared oligomer had a weight-average molecular weight of about 2,514.

II. Preparation of Polymers for Filling Fine Gaps

Example 7

The oligomer of formula 1a prepared in Example 1 and the oligomer of formula 2a prepared in Example 4 were introduced at a weight ratio of 3:7, and dissolved at 20° C. for 30 minutes. Then, 0.05 mol of nitric acid was added thereto, and the solution was heated to 80° C. over 30 minutes, and then allowed to react for 2 hours, thereby preparing the copolymer of formula 3a. The prepared copolymer had a weight-average molecular weight of about 11,410.

Example 8

The oligomer of formula 1c prepared in Example 3 and the oligomer of formula 2a prepared in Example 4 were introduced at a weight ratio of 3:7, and dissolved at 20° C. for 30 minutes. Then, 0.05 mol of nitric acid was added thereto, and the solution was heated to 80° C. over 30 minutes, and then allowed to react for 2 hours, thereby preparing the copolymer of formula 3d. The prepared copolymer had a weight-average molecular weight of about 9,514.

Example 9

The oligomer of formula 1c prepared in Example 3 and the oligomer of formula 2b prepared in Example 5 were introduced at a weight ratio of 3:7, and dissolved at 20° C. for 30 minutes. Then, 0.05 mol of nitric acid was added thereto, and the solution was heated to 80° C. over 30 minutes, and then allowed to react for 2 hours, thereby preparing the copolymer of formula 3f. The prepared copolymer had a weight-average molecular weight of about 9,935.

III. Preparation of Compositions

Example 10

10 g of the polymer of formula 3a, prepared in Example 7, and 100 g of propylene glycol monomethyl ether, were mixed with each other, thereby preparing a composition (solid content: 10 wt %) for filling fine gaps according to the present invention.

Example 11

10 g of the polymer of formula 3d, prepared in Example 8, and 100 g of propylene glycol monomethyl ether, were mixed with each other, thereby preparing a composition (solid content: 10 wt %) for filling fine gaps according to the present invention.

Example 12

10 g of the polymer of formula 3f, prepared in Example 9, and 100 g of propylene glycol monomethyl ether, were mixed with each other, thereby preparing a composition (solid content: 10 wt %) for filling fine gaps according to the present invention.

Comparative Example 1

A copolymer was prepared in the same manner as described in Example 7, except that the oligomer of formula 1a prepared in Example 1 and the oligomer of formula 2a prepared in Example 4 were introduced at a weight ratio of 1.5:7. The prepared copolymer had a weight-average molecular weight of about 12,357.

Then, 10 g of the prepared copolymer (Mw=12,357) and 100 g of propylene glycol monomethyl ether were mixed with each other, thereby preparing a composition (solid content: 10 wt %) for filling fine gaps.

Comparative Example 2

A copolymer was prepared in the same manner as described in Example 7, except that the oligomer of formula 1a prepared in Example 1 and the oligomer of formula 2a prepared in Example 4 were introduced at a weight ratio of 3:3.5. The prepared copolymer had a weight-average molecular weight of about 8,810.

Then, 10 g of the prepared copolymer (Mw=8,810) and 100 g of propylene glycol monomethyl ether were mixed with each other, thereby preparing a composition (solid content: 10 wt %) for filling fine gaps.

Test Examples

Test Example 1: Measurement of Dielectric Constant

The dielectric constants of the gap-filling compositions of Examples 10 to 12 and Comparative Examples 1 and 2 were measured, and the results of the measurement are shown in Table 1 below.

The dielectric constant can be measured using a metal-insulator semiconductor (MIS) method.

In the MIS method, a capacitor is fabricated. A silver paste having a thickness of about 120 nm is used as a top electrode, and a wafer having a low resistance value (0.0001 Ωcm) is used as a bottom electrode. The capacitance—voltage (C-V) value of the fabricated capacitor is measured using a wafer prober (4200CSC, CASCADE) at 1 MHz. Then, the measured C-V value, the thickness and the area can be applied to the following equation 1, thereby calculating the dielectric constant value of the thin film.

$$C=(\epsilon_i \epsilon_0 A)/d \qquad \text{Equation 1}$$

wherein C: capacitance; $\epsilon_i$: relative dielectric constant; $\epsilon_0$: vacuum dielectric constant; A: the area of the electrode; and d: thickness of the thin film.

TABLE 1

|  | Dielectric constant (k) |
|---|---|
| Example 10 | 2.00 |
| Example 11 | 2.20 |
| Example 12 | 2.10 |
| Comparative Example 1 | 4.16 |
| Comparative Example 2 | 3.51 |

As can be seen in Table 1 above, the dielectric constants of the gap-filling compositions prepared in Examples 10 to 12 of the present invention were 2.00, 2.20, and 2.10 respectively. However, the dielectric constant of the composition of Comparative Examples 1 and 2 were 4.16 and 3.51, respectively.

Test Example 2: Measurement of Optical Properties

Each of the gap-filling compositions of Examples 10 to 12 and Comparative Examples 1 and 2 was spin-coated on a 12-inch wafer (SFX100, KLA-TENCOR) by use of a track system (TEL-ACT-8, TEL), and then baked in three steps (at 80° C., 250° C. and 400° C.) for 60 seconds to thereby form cured coating films.

The uniformity of each of the formed coating films was measured, and the results of the measurement are shown in Table 2 below. Herein, the uniformity can be can be calculated using the following equation 2.

$$\text{Uniformity (\%)} = (\text{largest thickness value} - \text{smallest thickness value})/(2*(\text{average thickness}))*100 \qquad \text{Equation 2}$$

TABLE 2

|  | Thickness (Å) | Refractive index (n) @633 nm | Absorption coefficient (k) @633 nm | Uniformity (%) |
|---|---|---|---|---|
| Example 10 | 2889 | 1.38 | 0 | 0.39 |
| Example 11 | 2907 | 1.38 | 0 | 0.72 |
| Example 12 | 2868 | 1.39 | 0 | 0.77 |
| Comparative Example 1 | 2872 | 139 | 0 | 3.20 |
| Comparative Example 2 | 3653 | 1.35 | 0 | 2.57 |

As can be seen in Table 2 above, the uniformity of the coating films formed using the fine gap-filling compositions of Examples 10 to 12 of the present invention was better than that of the coating films formed using the compositions of Comparative Examples 1 and 2. Thus, it can be seen that the films formed using the compositions of the Examples were free of voids or cracks, indicating that the state of the films is good.

In addition, it can be seen that a good coating uniformity value was obtained in all the compositions of the Examples, and particularly, the copolymer-containing composition of Example 10 showed better uniformity.

Test Example 3: Test for Gap Filling Properties

A contact hole having a depth of 3.2 μm and a diameter of 180 nm was formed in a 12-inch wafer, and then the gap-filling composition of each of Examples 10 to 12 was spin-coated on the 12-Inch wafer by use of a track system (TEL-ACT-8, TEL) and baked at three steps, a first step at 80° C. for about 60 seconds, a second step at 250° C. for about 60 seconds and a third step at 400° C. for about 10 minutes, thereby forming uniform coating films. The gap-filling properties of the formed coating films were measured using a FE-SEM (Jeol, 15 kv, 20 k magnification), and the results of the measurement are shown in FIGS. 1 to 3.

Figure 4:
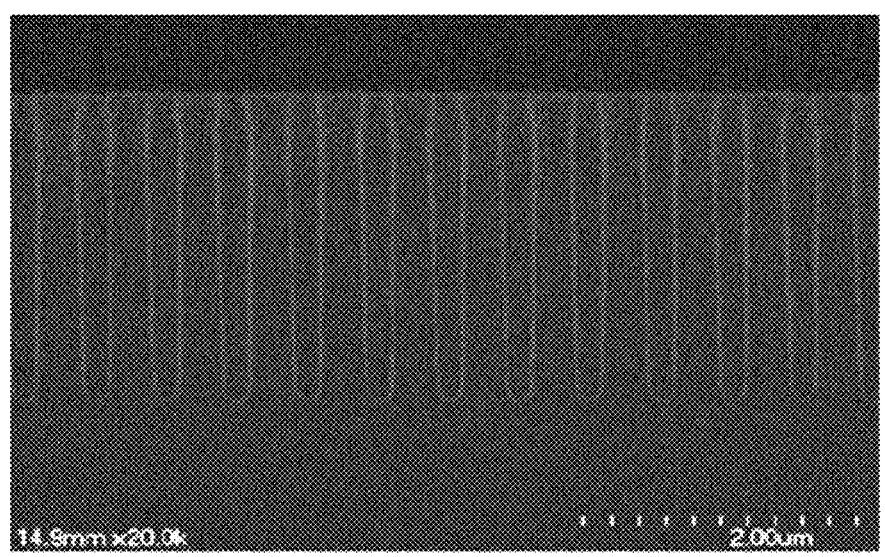
FIGS. 4 to 5 are scanning electron microscope (SEM) photographs showing the gap filling properties of fine gap-filling compositions according to Comparative Examples 1 and 2.
Figure 5:
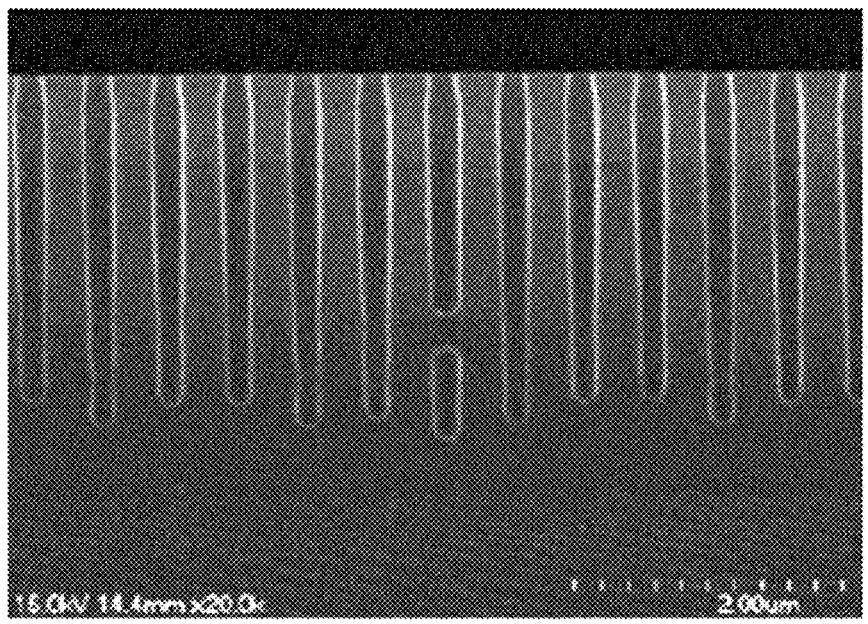

In addition, the gap-filling composition of each of Comparative Examples 1 and 2 was spin-coated on a wafer, and then baked at three steps, a first step at 80° C. for about 60 seconds, followed by a second step at 250° C. for about 60 seconds, and followed by a third step at 400° C. for about 10 minutes, thereby forming coating films. The gap-filling properties of the formed coating films were measured using a FE-SEM (Jeol, 15 kv, 20 k magnification), and the results of the measurement are shown in FIGS. 4 and 5.

Figure 2:
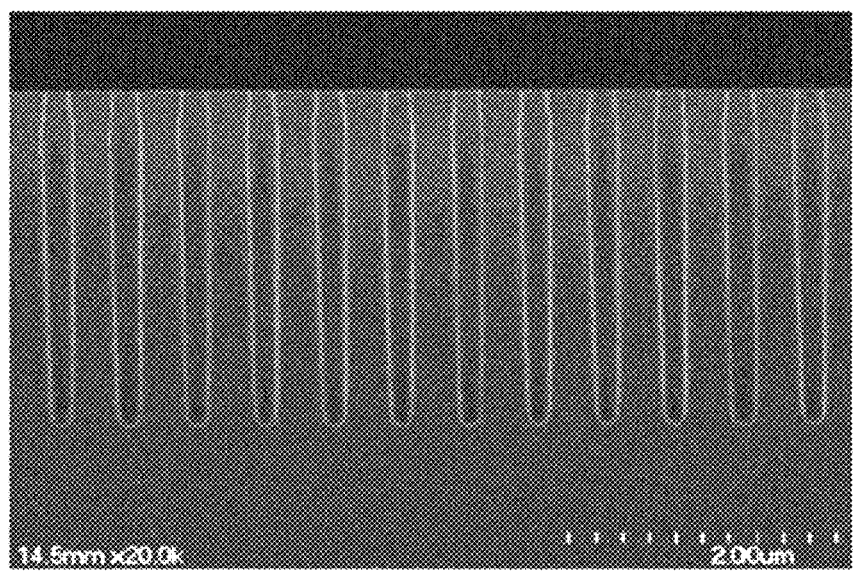
Figure 3:
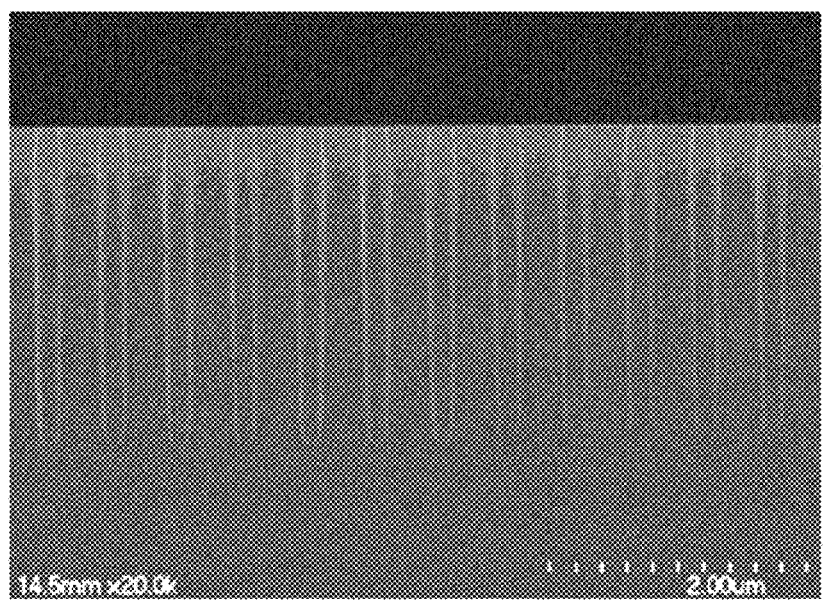

Referring to FIGS. 1 to 5, it can be seen that the composition of Comparative Example 2 showed poor gap-filling performance (see FIG. 5) as indicated by the discontinuity of the gaps, but the insulating films formed using the compositions of the present invention showed excellent gap-filling properties (see FIGS. 1 to 3).

Meanwhile, it can be seen that the composition of Comparative Example 1 (FIG. 4) showed good gap-filling performance, but the physical properties (such as volume shrinkage) were poor as described below.

Test Example 4: Test for Volume Shrinkage

The thickness of each coating film after formation of the coating film in Test Example 1, but before the baking process, was measured, and the thickness of each coating film after the three-step baking process was also measured. The results of the measurement are shown in Table 3 below.

TABLE 3

|  | Thickness (Å) | | Shrinkage rate |
| --- | --- | --- | --- |
|  | Initial thickness | Thickness after baking | Reduced thickness Å (%) |
| Example 10 | 3115 | 2889 | 225 (7.2%) |
| Example 11 | 3139 | 2907 | 232 (7.4%) |
| Example 12 | 3065 | 2868 | 196 (6.4%) |
| Comparative Example 1 | 3063 | 2672 | 391 (12.8%) |
| Comparative Example 2 | 4392 | 3653 | 739 (16.8%) |

As can be seen in Table 3 above, the shrinkage rate of each of the coating films using the fine gap-filling compositions of Examples 10 to 12 according to the present invention was lower than those of the coating films using the compositions of Comparative Examples 1 and 2.

As described above, according to the present invention, the gap-fill polymer for filling fine pattern gaps, which has a low dielectric constant and excellent gap-filling properties and coating properties, is used to form a semiconductor insulating film, and thus a low-dielectric semiconductor insulating film having the property of uniformly filling gaps can be formed. Accordingly, a semiconductor device having excellent capacitance and stability can be fabricated.

While various embodiments have been described above, it will be understood to those skilled in the art that the embodiments described are by way of example only. Accordingly, the composition and method described herein should not be limited based on the described embodiments.

What is claimed is:

1. A gap-fill polymer for filling fine photoresist pattern gaps of a semiconductor device, the gap-fill polymer comprising a compound formed by condensation polymerization of a first oligomer represented by the following formula 1 and a second oligomer represented by the following formula 2:

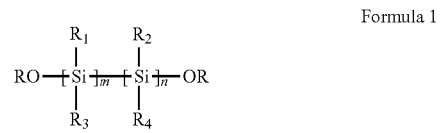

Formula 1 wherein R is hydrogen or a substituted or unsubstituted $C_1$-$C_{18}$ alkyl group; $R_1$ to $R_4$ are each one independently selected from the group consisting of a hydrogen atom, a substituted or unsubstituted $C_1$-$C_{18}$ alkyl group, a substituted or unsubstituted $C_2$-$C_{10}$ alkenyl group, a substituted or unsubstituted $C_3$-$C_{10}$ cycloalkyl group, a substituted or unsubstituted $C_6$-$C_{18}$ aryl group, a substituted or unsubstituted $C_6$-$C_{18}$ aralkyl group, and a substituted or unsubstituted $C_6$-$C_{18}$ alkaryl group; and each of m and n represents a number of repeating units in a main chain of the first oligomer, and a molar ratio of m:n is 1:0.01 to 30;

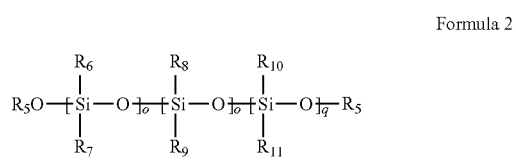

Formula 2

Wherein $R_5$ is selected from the group consisting of a hydrogen atom, a hydroxyl group, a substituted or unsubstituted $C_1$-$C_{18}$ alkyl group; $R_6$ to $R_{11}$ are each one independently selected from the group consisting of a hydrogen atom, a substituted or unsubstituted $C_1$-$C_{18}$ alkyl group, a substituted or unsubstituted $C_1$-$C_{18}$ alkenyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group; and each of o, p and q represents a number of repeating units in a main chain of the second oligomer, and a molar ratio of o:p:q is 1:0.01 to 30:0.01 to 30.

2. The gap-fill polymer of claim 1, wherein the first oligomer represented by formula 1 comprises at least one compound selected from the group consisting of compounds represented by the following formulas 1a to 1c:

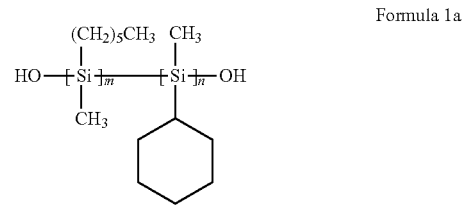

Formula 1a

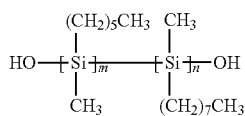
Formula 1b

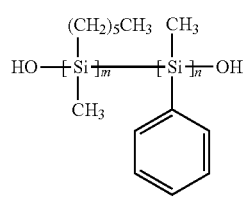
Formula 1c wherein the molar ratio of m:n is 1:0.01 to 30.

3. The gap-fill polymer of claim 1, wherein the second oligomer represented by formula 2 comprises at least one compound selected from the group consisting of compounds represented by the following formulas 2a to 2c:

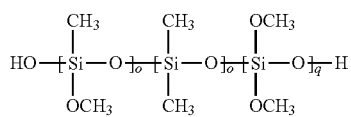
Formula 2a

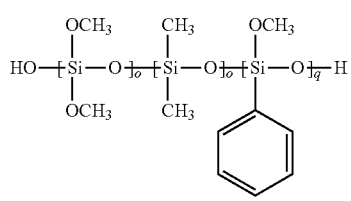
Formula 2b

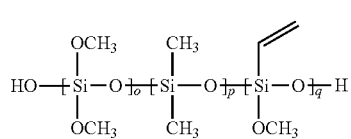
Formula 2c wherein the molar ratio of o:p:q is 1:0.01 to 30:0.01 to 30.

4. The gap-fill polymer of claim 1, comprising a compound represented by the following formula 3:

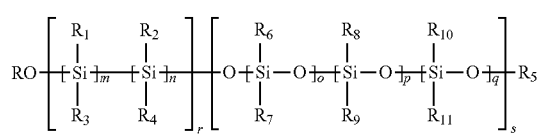
Formula 3 wherein
R is hydrogen or a substituted or unsubstituted $C_1$-$C_{18}$ alkyl group;
$R_1$ to $R_4$ are each one independently selected from the group consisting of a hydrogen atom, a substituted or unsubstituted $C_1$-$C_{18}$ alkyl group, a substituted or unsubstituted $C_2$-$C_{10}$ alkenyl group, a substituted or unsubstituted $C_3$-$C_{10}$ cycloalkyl group, a substituted or unsubstituted $C_6$-$C_{18}$ aryl group, a substituted or unsubstituted $C_6$-$C_{18}$ aralkyl group, and a substituted or unsubstituted $C_6$-$C_{18}$ alkaryl group; $R_5$ is hydrogen, a hydroxyl group, or a substituted or unsubstituted $C_1$-$C_{18}$ alkyl group;
$R_6$ to $R_{11}$ are each one independently selected from the group consisting of a hydrogen atom, a substituted or unsubstituted $C_1$-$C_{18}$ alkyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group; and
each of m, n, o, p, q, r and s represents the number of repeating units in the main chain,
the molar ratio of m:n is 1:0.01 to 30,
the molar ratio of o:p:q is 1:0.01 to 30:0.01 to 30, and
the molar ratio of r:s is 10:90 to 90:10.

5. The gap-fill polymer of claim 4, wherein the polymer represented by formula 3 comprises at least one compound selected from the group consisting of the following formulas 3a to 3i:

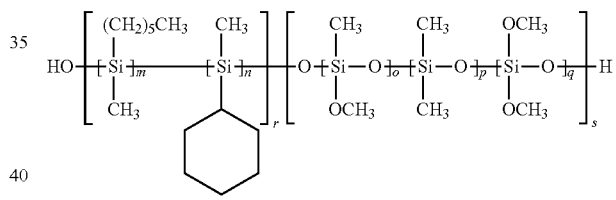
Formula 3a

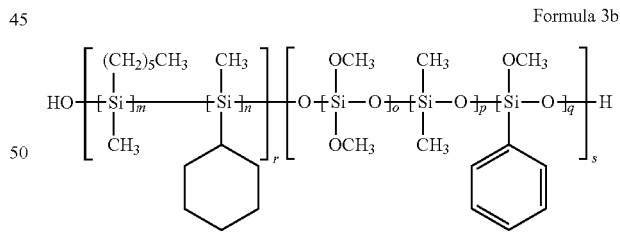
Formula 3b

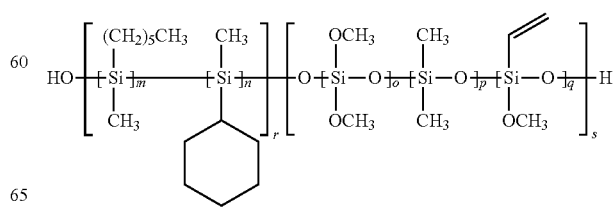
Formula 3c

Formula 3d
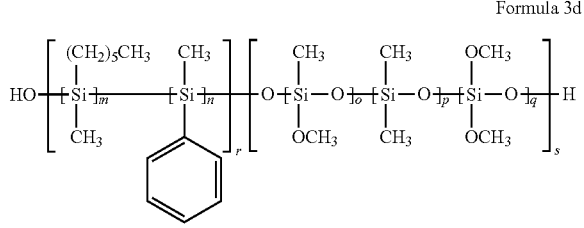

Formula 3e
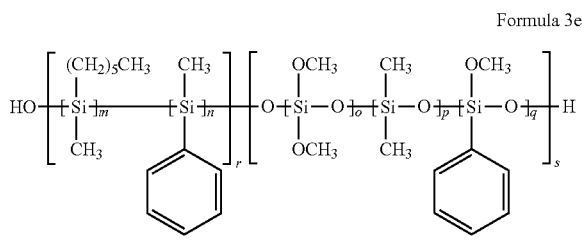

Formula 3f
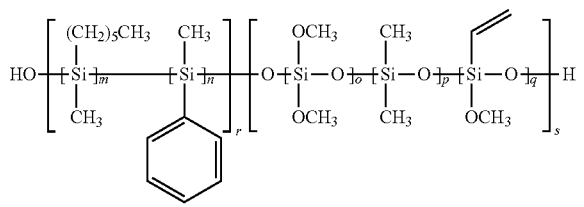

Formula 3g
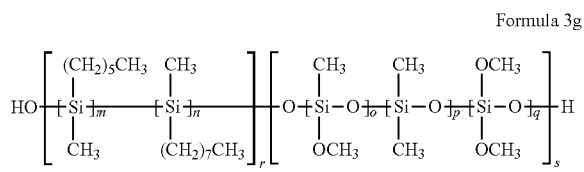

Formula 3h
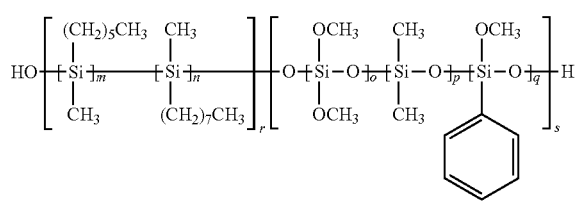

Formula 3i
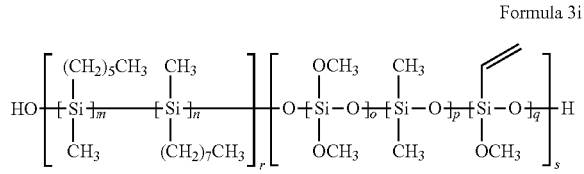

wherein
the molar ratio of m:n is 1:0.01 to 30,
the molar ratio of o:p:q is 1:0.01 to 30:0.01 to 30, and
the molar ratio of r:s is 10:90 to 90:10.

6. The gap-fill polymer of claim 1, having a weight-average molecular weight (Mw) of 1,000-20,000.

7. The gap-fill polymer of claim 6, having a weight-average molecular weight (Mw) of 3,000-18,000.

8. A method for preparing gap-fill polymer for fine photoresist patterns of a semiconductor device according to claim 1, the method comprising:
dissolving the second oligomer represented by the following formula 2 in a polymerization solvent;
adding the first oligomer represented by the following formula 1 to the polymerization solvent; and
polymerizing the first oligomer of formula 1 with the second oligomer of formula 2 in the presence of an acid or base catalyst while hydrolyzing the first and second oligomers:

Formula 1
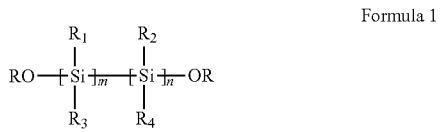

wherein
R is hydrogen or a substituted or unsubstituted $C_1$-$C_{18}$ alkyl group;
$R_1$ to $R_4$ are each one independently selected from the group consisting of a hydrogen atom, a substituted or unsubstituted $C_1$-$C_{18}$ alkyl group, a substituted or unsubstituted $C_2$-$C_{10}$ alkenyl group, a substituted or unsubstituted $C_3$-$C_{10}$ cycloalkyl group, a substituted or unsubstituted $C_6$-$C_{18}$ aryl group, a substituted or unsubstituted $C_6$-$C_{18}$ aralkyl group, and a substituted or unsubstituted $C_6$-$C_{18}$ alkaryl group; and each of m and n represents a number of repeating units in a main chain of the first oligomer, and a molar ratio of m:n is 1:0.01 to 30;

Formula 2
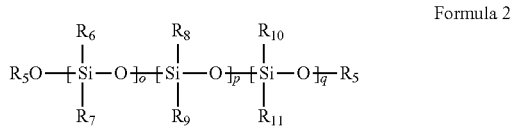

wherein
$R_5$ is selected from the group consisting of a hydrogen atom, a hydroxyl group, a substituted or unsubstituted $C_1$-$C_{18}$ alkyl group; $R_6$ to $R_{11}$ are each one independently selected from the group consisting of a hydrogen atom, a substituted or unsubstituted $C_1$-$C_{18}$ alkyl group, a substituted or unsubstituted $C_1$-$C_{18}$ alkenyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group; and each of o, p and q represents a number of repeating units in a main chain of the second oligomer, and a molar ratio of o:p:q is 1:0.01 to 30:0.01 to 30.

9. The method of claim 8, wherein the second oligomer represented by formula 2 is prepared by dissolving at least two alkoxysilane compounds represented by the following formula 4 in water, and then hydrating the compounds in the presence of an acid catalyst, followed by heating of the hydrated compounds:

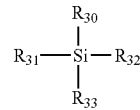

Formula 4 wherein $R_{30}$ $R_{31}$, $R_{32}$ and $R_{33}$ are each independently selected from at least one of the group consisting of a hydrogen atom, a substituted or unsubstituted $C_1$-$C_{18}$ alkyl group, a substituted or unsubstituted $C_1$-$C_{18}$ alkenyl group, a substituted or unsubstituted $C_1$-$C_{18}$ alkoxy group, a substituted or unsubstituted $C_6$-$C_{18}$ aryl group, a substituted or unsubstituted $C_3$-$C_{18}$ alkyl acrylate group, a substituted or unsubstituted $C_4$-$C_{18}$ alkyl methacrylate group, a substituted or unsubstituted $C_1$-$C_{18}$ aminoalkyl group, and a substituted or unsubstituted $C_1$-$C_{18}$ alkylvinyl group.

10. The method of claim 8, wherein the first oligomer represented by formula 1 is prepared by dissolving at least two compounds represented by the following formula 5 in a polymerization solvent, and then reacting the compounds in the presence of an alkali metal catalyst:

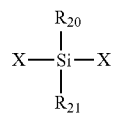

Formula 5 wherein $R_{20}$ to $R_{21}$ are each one independently selected from the group consisting of a hydrogen atom, a substituted or unsubstituted $C_1$-$C_{18}$ alkyl group, a substituted or unsubstituted $C_2$-$C_{10}$ alkenyl group, a substituted or unsubstituted $C_3$-$C_{10}$ cycloalkyl group, a substituted or unsubstituted $C_6$-$C_{18}$ aryl group, a substituted or unsubstituted $C_6$-$C_{18}$ aralkyl group, and a substituted or unsubstituted $C_6$-$C_{18}$ alkaryl group, and X is a halogen atom.

11. The method of claim 8, wherein the first oligomer represented by formula 1 and the second oligomer represented by formula 2 are mixed with each other at a weight ratio of 1:9 to 5:5.

12. The method of claim 8, wherein the acid catalyst is hydrochloric acid, nitric acid, benzenesulfonic acid, oxalic acid, formic acid, or a mixture of two or more thereof.

13. The method of claim 8, wherein the acid or base catalyst is used in an amount of 0.001-5 parts by weight based on 100 parts by weight of the total weight of the first and second oligomers.

14. A gap-fill composition for filling fine pattern gaps of a semiconductor device, the composition comprising:
   a gap-fill polymer for filling fine pattern gaps according to claim 1; and
   an organic solvent.

15. The gap-fill composition of claim 14, wherein the organic solvent is contained in an amount of 100-3,000 parts by weight based on 100 parts by weight of the gap-fill polymer for filling fine pattern gaps.

16. The gap-fill composition of claim 14, further comprising at least one additive selected from the group consisting of a crosslinking agent, a crosslinking promoter, and a surfactant.

17. A method for fabricating a semiconductor device, comprising:
   depositing an insulating film on a semiconductor substrate, followed by formation of a patterned hole;
   depositing an electrode material on a surface of the insulating film including the patterned hole;
   filling the patterned hole, which has the electrode material deposited therein, with a composition set forth in claim 14, followed by baking to planarize a surface of a layer formed of the composition, thereby performing gap-filling;
   selectively developing and removing the composition coated on a top of the electrode material;
   selectively etching the top of the electrode material to remove the electrode material from the top; and
   removing the insulating film and the composition at the same time by wet etching.

18. The method of claim 17, wherein the baking is performed at a temperature between 50° C. and 500° C. for 30-300 seconds.

19. The method of claim 17, wherein the baking is performed in two or three steps.

20. A semiconductor device fabricated by the method of claim 17.

* * * * *